United States Patent
Holz

(10) Patent No.: US 6,762,066 B2
(45) Date of Patent: Jul. 13, 2004

(54) METHOD FOR FABRICATING A SEMICONDUCTOR STRUCTURE USING A PROTECTIVE LAYER, AND SEMICONDUCTOR STRUCTURE

(75) Inventor: Juergen Holz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/245,627

(22) Filed: Sep. 17, 2002

(65) Prior Publication Data

US 2003/0073297 A1 Apr. 17, 2003

(30) Foreign Application Priority Data

Sep. 17, 2001 (DE) .......................................... 101 45 724

(51) Int. Cl.[7] .............................................. H01L 21/00
(52) U.S. Cl. .................................. 438/4; 438/5; 438/12
(58) Field of Search .............................. 438/4, 5, 7, 10, 438/12, 14

(56) References Cited

U.S. PATENT DOCUMENTS

| | | |
|---|---|---|
| 4,654,269 A | 3/1987 | Lehrer |
| 5,472,370 A * | 12/1995 | Malshe et al. ................. 451/41 |
| 6,017,614 A | 1/2000 | Tsai et al. |
| 6,063,514 A * | 5/2000 | Nishioka et al. ............ 428/698 |
| 6,177,338 B1 | 1/2001 | Liaw et al. |
| 6,265,257 B1 * | 7/2001 | Hsu et al. .................... 438/215 |

FOREIGN PATENT DOCUMENTS

| | | | |
|---|---|---|---|
| DE | 689 18 301 T2 | 8/1989 | |
| EP | 0 312 154 A1 | 4/1989 | |
| EP | 0 316 550 A2 | 5/1989 | |
| EP | 0 327 412 B1 | 9/1994 | |
| JP | 02174269 A * | 7/1990 | ......... H01L/29/784 |
| JP | 03 213 870 | 9/1991 | |

OTHER PUBLICATIONS

Markstein, H.:"Packaging Ideas", Electronic Packaging & Production, Feb. 1992, p. 35.

* cited by examiner

Primary Examiner—Kevin M. Picardat
(74) Attorney, Agent, or Firm—Laurence A. Greenberg; Werner H. Stemer; Gregory L. Mayback

(57) ABSTRACT

A method produces a semiconductor structure on a substrate. Then, a protective layer is applied to the semiconductor structure. To fabricate a further semiconductor structure that is to be formed on the substrate, intermediate processes, which lead to the formation of cracks in the protective layer, are carrier out. The protective layer is repaired with the aid of a repair layer.

18 Claims, 3 Drawing Sheets

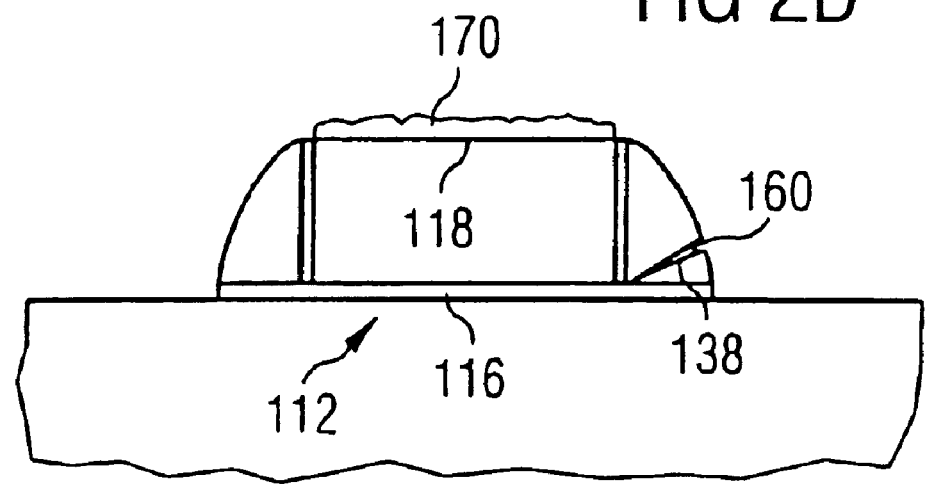
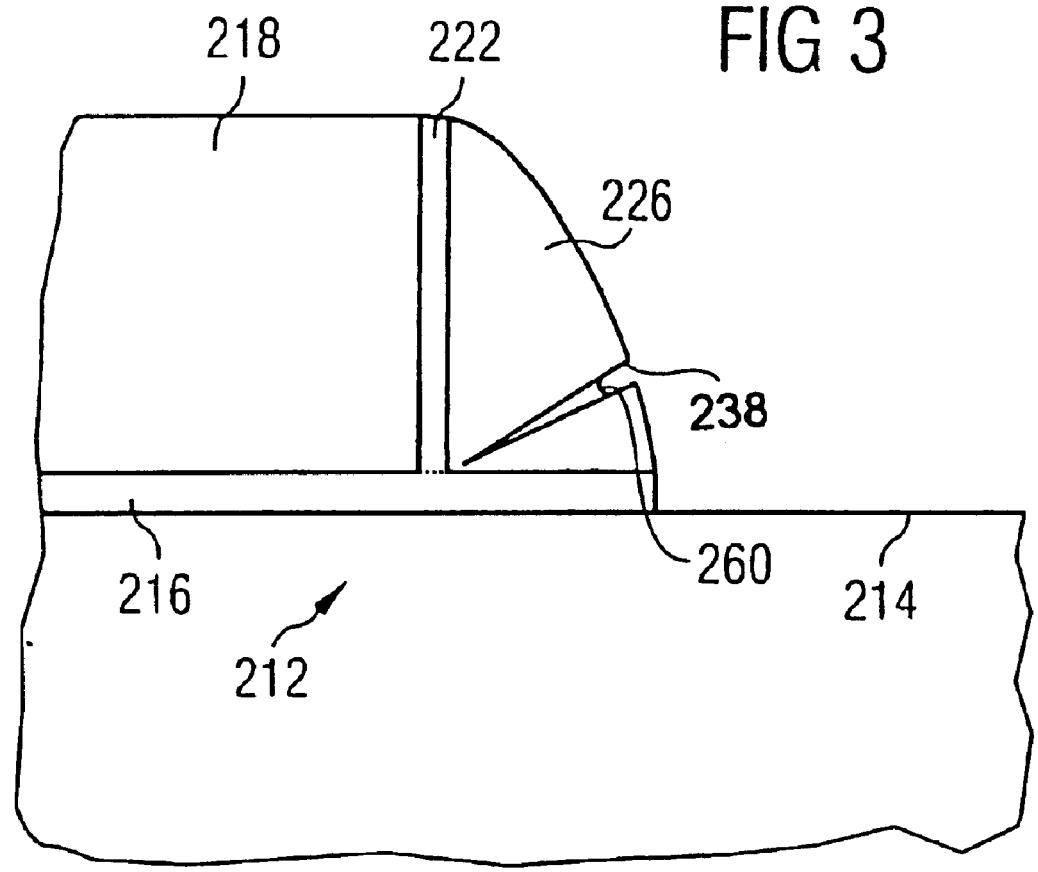

METHOD FOR FABRICATING A SEMICONDUCTOR STRUCTURE USING A PROTECTIVE LAYER, AND SEMICONDUCTOR STRUCTURE

BACKGROUND OF THE INVENTION

Field of the Invention

The invention relates to a method in which a semiconductor structure is produced on a substrate. A protective layer is applied to the semiconductor structure in order to protect the semiconductor structure from being impaired during subsequent processing steps. At least one intermediate process is carried out for further fabrication of the semiconductor structure or for fabrication of a further semiconductor structure that is to be formed on the substrate. The protective layer remains on the semiconductor structure or is removed from the semiconductor structure that is to be protected, for example in order for it to be structured further.

The substrate is, for example, a semiconductor wafer. However, ceramic substrates or thin-film substrates are also used.

One process is the processing of the substrate under constant process conditions in a processing installation, e.g. the execution of an oxidation step, the deposition of a layer, the application of a photomask, exposure, developing, etching, and/or ion implantation.

By way of example, to fabricate what are known as bipolar complementary metal oxide semiconductor circuits (BICMOS circuits), it is necessary to protect semiconductor structures in one base technology, while the semiconductor structures of the other base technology are being produced. Under certain circumstances, a repeated change between the regions that are in each case to be protected and the regions which are in each case to be processed may be necessary.

SUMMARY OF THE INVENTION

It is accordingly an object of the invention to provide a method for fabricating a semiconductor structure using a protective layer, and a semiconductor structure which overcome the above-mentioned disadvantages of the prior art devices and methods of this general type, which provides an improved method for fabrication of the semiconductor structure using a protective layer.

With the foregoing and other objects in view there is provided, in accordance with the invention, a fabrication method. The method includes providing a given structure being either a substrate or a semiconductor structure; applying a protective layer to the given structure; carrying out at least one intermediate process and the intermediate process leading to a formation of cracks in the protective layer resulting in an impairment of a protective action of the protective layer; applying a repair layer to the protective layer; and removing the repair layer before an application of further layers and/or before carrying out subsequent process steps.

The invention is based on the consideration that the known protective layers in principle ensure sufficient protection to, for example, avoid damage to the semiconductor structure that is to be protected. However, the protective layer is usually applied to a topological surface, i.e. to an uneven surface, for example with height differences of over 100 nm. While the intermediate processes are being carried out, the chemical and mechanical properties of the protective layer are influenced.

By way of example, heat causes a shrinkage of the protective layer, so that tensile forces are formed in the lateral direction. The tensile forces lead to the formation of shear forces and possibly also of notch effects in particular at the locations at which height differences occur in the protective layer. On account of the lateral forces, cracks and gaps may form in the protective layer.

By way of example, on a wafer with a diameter of, for example, 6" or 12" (inches) only three or four such cracks are formed. The cracks are highly disruptive in particular because they reduce the effectiveness of the protective layer, so that components that are unable to function are fabricated or long-term reliability problems arise. Deposits that penetrate into the crack often only diffuse very slowly to the semiconductor structure, where they lead to delayed failures that only occur in the end product. The crack is, for example, only a few nanometers wide and only a few nanometers deep. The length of the crack is, for example, a few nanometers, a few tens of nanometers or a few hundred nanometers.

Moreover, the invention is based on the consideration that only with great difficulty is it possible to reduce the number of cracks, since measures aimed at avoiding the formation of cracks are highly complex.

Therefore, in the method according to the invention, a protective layer that is of a thickness at which cracks occur during the intermediate processes is applied. In other words, the formation of cracks is accepted in the method according to the invention. However, in the method according to the invention, a repair layer is applied to the protective layer whose protective action has been impaired, and the repair layer increases the protective effect of the protective layer again in such a way that the repaired protective layer once again effectively protects the semiconductor structure which is to be protected during subsequent processes.

In the method according to the invention, the repair layer is removed again, for example, by a fixed-time etch or an end-point etch, before further layers are applied and/or before the subsequent processes are carried out, in order for the substrate to be processed further. However, residues of the repair layer remain in the cracks in the protective layer and also, in the case of relatively deep cracks, in the semiconductor structure which is to be protected or in a substrate which is to be protected. The residues in fact increase the protective effect of the protective layer. Moreover, it is only possible for residues of the repair layer to remain in the cracks in the protective layer if the protective layer has not been removed during removal of the repair layer.

Therefore, the result of the use of the method according to the invention is that even with a simple procedure, i.e. when a relatively thin protective layer is applied and, for example, when a protective layer which contains only one material is applied, a high protective action and therefore a high yield are nevertheless achieved after the repair. In particular, the particularly critical delayed failures are avoided. The application of a further layer with a complete protective action is dispensed with.

In a refinement of the method according to the invention, the thickness of the repair layer is significantly less than the thickness of the protective layer. By way of example, the thickness of the repair layer is less than approximately one-third of the thickness of the protective layer, less than approximately one-tenth of the thickness of the protective layer or less than approximately one-hundredth of the thickness of the protective layer. A repair layer for repairing a 100 nm (nanometer) thick protective layer has a thickness of, for example, 20 nm.

In one configuration, the thickness of the repair layer is half the maximum crack width, so that even the crack that has the greatest crack width is just still reliably filled. When all the cracks have been filled, the deposition of the repair layer is ended without the thickness of the repair layer being increased still further. The application of such a thin repair layer can be carried out quickly and easily. Moreover, a thin repair layer can be removed more easily than a thicker repair layer.

In a further refinement of the method according to the invention, the repair layer contains the same material as the material of the protective layer. The result of this is that the protective layer and the deposits of the repair layer that are present in the cracks have uniform etching properties. In this way, it is possible to effectively prevent the cracks from being etched open during subsequent etching operations. In one configuration, the repair layer is applied using the same process as the protective layer. This measure too leads, for example, to uniform etching properties of protective layer and repair layer. By way of example, the protective layer used may be TEOS (tetraethyl orthosilicate) which, by way of example, has been compacted or consolidated. In this case, TEOS is also used to repair the protective layer and is then likewise compacted.

In an alternative refinement, the repair layer is formed of a different material than the material of the protective layer. Degrees of freedom resulting from this measure make it possible to use layers of materials that also serve to fabricate structures in the unprotected regions of the substrate as the repair layer. In one configuration, the repair layer is applied using a different process than the protective layer, in which case the repair layer may optionally be formed of the same or a different material than the protective layer. This measure too brings degrees of freedom that make it possible for processes for applying or removing the repair layer subsequently also to be used to fabricate the structures in the regions that are not protected by the protective layer.

In a further refinement of the method according to the invention, the protective layer protects a field-effect structure, i.e. a structure whose operation is based on the field effect, e.g. a MOS (metal oxide silicon) structure. The structure includes, inter alia, a gate electrode, a gate insulation layer, a spacer and, if appropriate, also a lightly doped drain (LDD) connection region for source and drain regions which are themselves relatively highly doped, i.e. what are known as highly doped drain (HDD) regions. The method according to the invention is particularly suitable for protecting the entire gate, in particular for protecting the gate insulation layer. The gate insulation layer is only a few nanometers thick, and consequently it is highly sensitive, in particular including with regard to the diffusion of impurities into it, which impurities could reach the vicinity of the gate insulation layer through the unrepaired cracks.

In a further refinement of the method according to the invention, the further semiconductor structure is a bipolar transistor. In particular, for the fabrication of BICMOS structures, protective layers that offer effective protection are required. The use of the protective layers results in degrees of freedom in the process management which make it possible, by way of example, first to fabricate the buried layers for the collector connections of the bipolar transistor, then to completely or at least partially fabricate the MOS structures, and to fabricate the bipolar transistor further only after a protective layer has been applied to the MOS structure.

In a further refinement of the method according to the invention, conformal deposition is used to deposit the repair layer, the process is able to completely fill gaps or cracks, i.e. without leaving any cavities. The conformal deposition is achieved with a reaction-limited deposition process, i.e. a deposition process in which, unlike with a diffusion-limited deposition process, the deposition rate is limited by the reaction conditions, in particular by the temperature, but not by a deficit of particles that are to be deposited. A completely filled crack increases the protective effect of the protective layer considerably more successfully than a crack which is only partially filled and still includes a cavity, i.e. what is known as a void.

In another refinement of the method according to the invention, the protective layer is a silicon dioxide layer or a TEOS layer. Silicon dioxide or TEOS is like-wise used as material for the repair layer. The materials are easy to apply and remove again with the aid of etching processes.

In a further refinement, the semiconductor structure that is to be protected includes spacer structures for the implantation. The spacer structures are fabricated, for example, from silicon dioxide or from TEOS. Alternatively, however, it is also possible for nitride to be used as material for the spacer structures.

In a further refinement of the method according to the invention, the protective layer is removed again after the protective layer has been repaired and the subsequent processes have been carried out. The result of this measure is that the semiconductor structure that is to be protected can be processed further at a relatively late point in the overall process, for example, by forming a silicide layer. To remove the protective layer, it may also be necessary to remove the repair layer or a layer that has been applied to the repair layer. Cracks that penetrate through the protective layer remain closed even after the protective layer has been removed, for example, on account of an isotropic etching process being used to remove the protective layer.

In another refinement to the method according to the invention, the intermediate process is carried out at a temperature between approximately 700° C. to approximately 900° C. These temperatures often lead to particularly strong shrinkage of the protective layer as a result of thermal compression, for example, in the case of TEOS protective layers. Therefore, there is a particularly high risk of cracks being formed.

In a refinement, at least one subsequent process is such that without application of a repair layer the semiconductor structure that is to be protected by the protective layer would be damaged when subsequent processes are carried out, on account of the reduced protective effect, and/or their function, in particular their long-term function, would be impaired. In other words, the subsequent process extends all the way to the protective layer. On the other hand, the repair layer does not have to provide a sufficient protective effect with respect to the subsequent process on its own, and can therefore be very thin compared to the protective layer. A sufficient protective action results from the interaction of protective layer and repair layer or of the protective layer and residues of the repair layer in the cracks. By way of example, without a repair, it would be impossible to use an isotropic etching process to remove the protective layer, since the etching takes place significantly more quickly in the region of the unrepaired cracks. Also, a structure lying below the protective layer could no longer reasonably be used as an etching stop layer in a selective etching process for removing the unrepaired protective layer, since the etchant bypasses the etching stop layer through the cracks. A further example of a subsequent process which extends as far as the protective layer is a furnace process in which, although contamination and/or impurities penetrate through the thin repair layer, they are stopped by the protective layer or by the material of the repair layer which is present in the cracks.

Moreover, the invention relates to a semiconductor structure that includes a crack that has been repaired. In refinements, the semiconductor structure has been fabricated using the method according to the invention or a refinement of the method according to the invention. Accordingly, the technical effects that have been described above also apply to the semiconductor structure and its refinements.

With the foregoing and other objects in view there is further provided, in accordance with the invention, a semiconductor structure. The semiconductor structure contains a substrate, at least one component structure applied to the substrate and has at least one crack formed therein, and a repair layer having a repair material filling the crack. The repair layer is removed again before further layers are applied and/or before subsequent processes are carried out.

Other features which are considered as characteristic for the invention are set forth in the appended claims.

Although the invention is illustrated and described herein as embodied in a method for fabricating a semiconductor structure using a protective layer, and a semiconductor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2A to 2D are diagrammatic, sectional views showing method steps for repairing the protective layer which is removed again from the structure which is to be protected; and FIG. 3 is a diagrammatic, sectional view of a transistor structure with a spacer made from nitride.

DESCRIPTION OF THE PREFERRED EMBODIMENTS

Figure 1A:
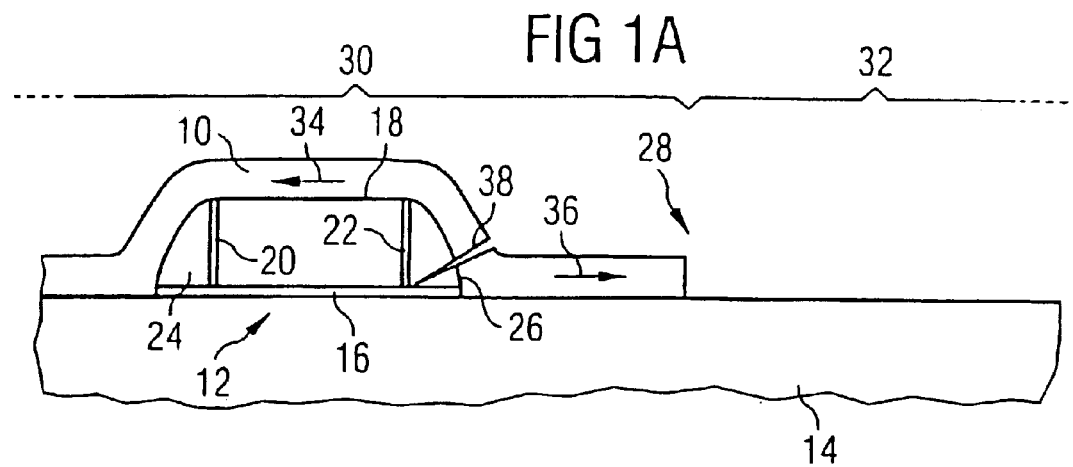
FIGS. 1A to 1D are diagrammatic, sectional views showing method steps for repairing a protective layer which remains on a structure which is to be protected according to the invention.
Figure 1B:
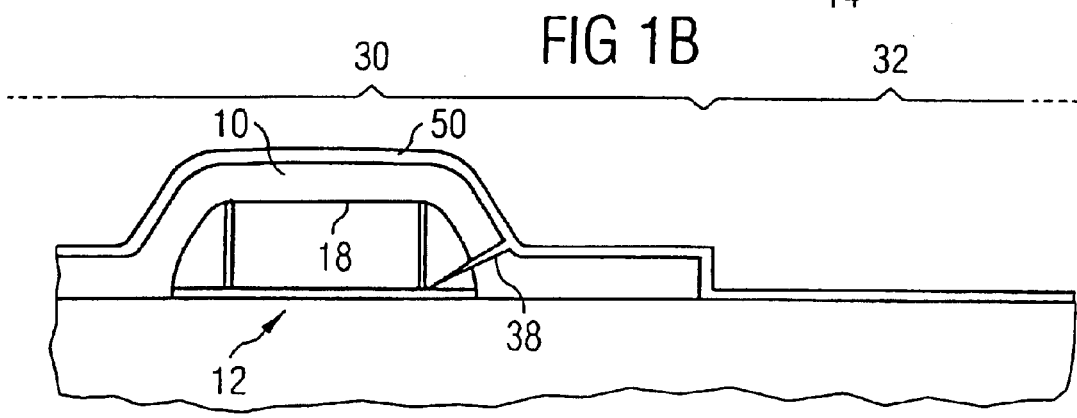
Figure 1C:
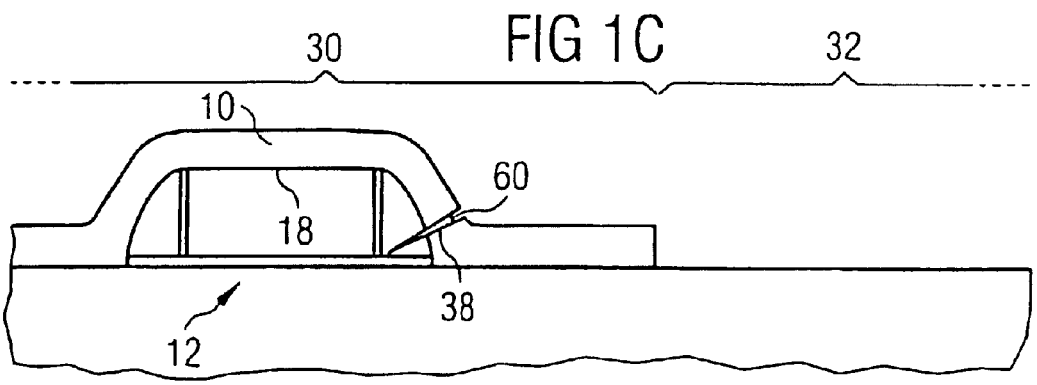

Referring now to the figures of the drawing in detail and first, particularly, to FIGS. 1A–1C thereof, there is shown method steps for repairing a protective layer 10 which has been applied to a transistor structure 12 which is to be protected. The transistor structure 12 is situated on a silicon semiconductor wafer 14 that has a thickness of 770 µm (micrometers) and a diameter of, for example, 300 mm (12 inches). However, the method steps are not dependent on the size of the wafer.

The transistor structure 12 includes a thin gate oxide 16 that is, for example, 7.5 nm (nanometers) or 15 nm thick. The gate oxide 16 is formed by a silicon dioxide layer, which has been applied directly to the wafer 14. A different dielectric, for example silicon nitride, can also be used instead of the silicon dioxide layer.

Then, a gate electrode 18 is fabricated on the gate oxide 16 by deposition of a polysilicon layer and doping and patterning of the polysilicon layer. Side wall oxide 20, 22, for example silicon dioxide once again, are deposited at the sides of the gate electrode 18. The side wall oxide 20 or 22 separates the gate electrode 18 from spacers 24 or 26, which are formed from TEOS which has been compacted in a compacting process.

Moreover, the transistor structure 12 includes a p-doped channel region and n-doped connection regions which, however, are not shown in FIG. 1A. Drain-source regions, which are likewise to be provided with a p-doping, are subsequently implanted with the aid of the spacers 24, 26.

The protective layer 10 formed of TEOS, has a thickness of, for example, 100 nm and is patterned with the aid of a photolithography process after it has been deposited. See for example edge 28, which separates a region 30 that is to be protected from a region 32 that is not to be protected.

After the patterning of the protective layer 10, method steps required for fabrication of a bipolar transistor are carried out in the region 32 which is not to be protected, but these steps are not explained in further detail. However, for the method steps for fabrication of the bipolar transistor, it is necessary to heat the wafer 14 and therefore also the transistor structure 12 and the protective layer 10 to a temperature of approximately 700° C., for example, i.e. to a temperature that is typical of layer deposition steps. However, by way of example, the heating also anneals implanted regions of the bipolar transistor at approximately 1000° C. On account of the heating, the protective layer 10 shrank, for example, by 10%. The shrinkage gave rise to tensile forces, which are illustrated by arrows 34 and 36 in FIG. 1A. On account of the tensile forces 34 and 36, a shear force was formed in the region of the spacers 24 and 26 and, in the region of the spacer 26, led to the formation of a crack 38 which formed through the protective layer 10 and into the spacer 26.

The position and direction of the crack 38 shown in FIG. 1A is only an example. For example, there are cracks that make contact with the spacer 26 elsewhere, have a different positional angle with respect to the surface of the wafer 14, and have a different crack depth than the crack 38 illustrated in FIG. 1A. For example, there are also cracks which extend all the way into the wafer 14 and which do not completely penetrate the protective layer 10. The length of the cracks also differs.

FIG. 1B shows the transistor structure 12 illustrated in FIG. 1A after the application of a repair layer 50 that likewise contains TEOS. The repair layer 50 is significantly thinner than the protective layer 10, for example the repair layer 50 has a thickness of only 20 nm. The repair layer 50 was applied using reaction conditions that ensure conformal deposition, so that the repair layer 50 has a uniform thickness of 20 nm both in the region 30 that is to be protected and in the region 32 that is not to be protected. In the exemplary embodiment shown in FIG. 1B, the repair layer 50 remains in place over a large area on the protective layer 10 and on the region 32.

FIG. 1C shows the structure illustrated in FIG. 1B after an etching-back step in which only the repair layer 50 has been removed but the protective layer 10 remains on the transistor structure 12 and on the wafer 14. There was no over-etching, i.e. the protective layer 10 retains its original thickness. Residues 60 that continue to substantially completely close up the crack 38 remain in the region of the crack 38. The etching back uncovers the region 30 that is not to be protected again.

Figure 1D:
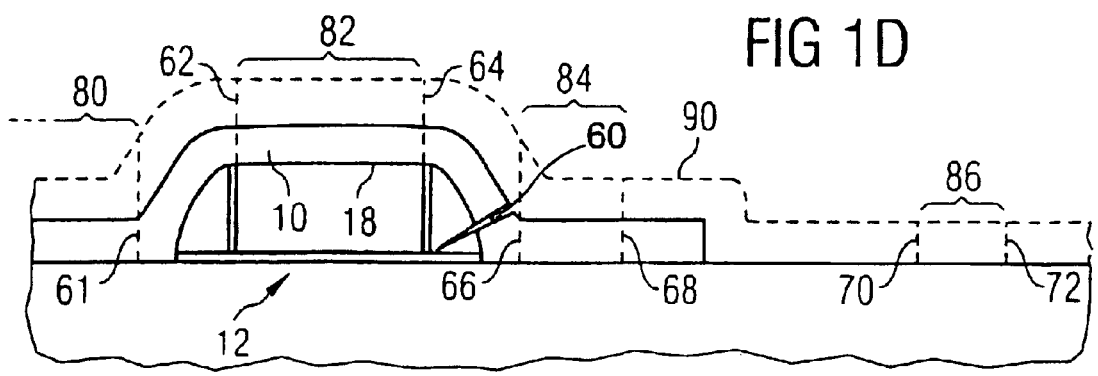

With the aid of dashed lines 61 to 72, FIG. 1D shows regions 80 to 86 in which the protective layer 10 and if appropriate further layers 90 are removed in order for metallization to be introduced.

The repair to the crack 38 prevents impurities from penetrating into the crack 38 during application of the layers 90 or during the execution of other processes.

FIGS. 2A to 2D show, in a second exemplary embodiment, method steps used to repair a protective layer 110 which, after it has carried out its protective function, is removed again from a transistor structure 112 which is to be protected.

The transistor structure 112 includes a thin gate oxide 116 that is, for example, 7.5 nm or 15 nm thick. The gate oxide 116 is formed by a silicon dioxide layer, which has been deposited directly on a silicon semiconductor wafer 114. A gate electrode 118 is fabricated on the gate oxide 116 by deposition of a polysilicon layer and doping and patterning of the polysilicon layer. Side wall oxide 120, 122, for example likewise silicon dioxide, are deposited at the sides of the gate electrode 118. The side wall oxide 120 and 122 separates the gate electrode 118 from spacers 124 and 126, which are formed from TEOS which has been compacted in a compacting process.

Figure 2A:
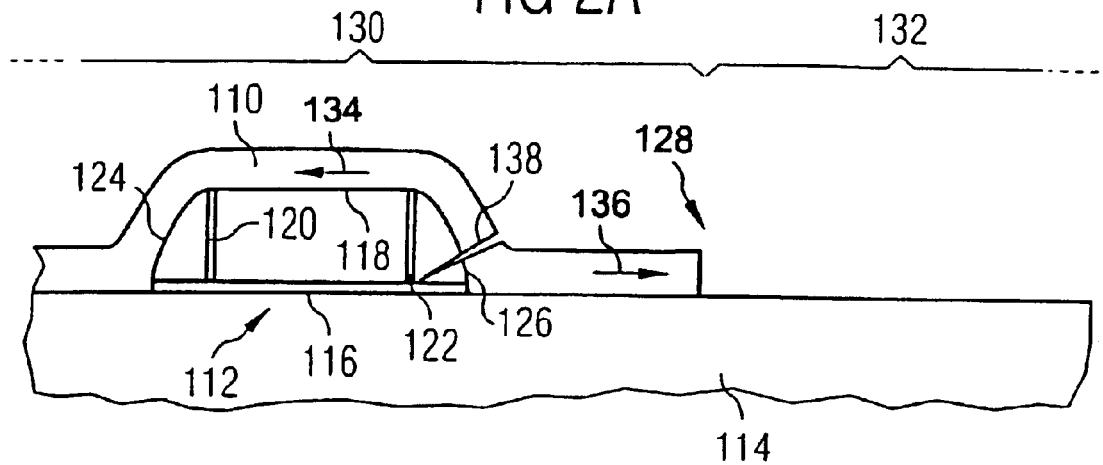

Moreover, the transistor structure 112 includes an n-doped channel region and p-doped connection regions which, however, are not shown in FIG. 2A. The drain-source regions, which are likewise to be provided with a p-doping, are subsequently implanted with the aid of the spacers 124, 126.

The protective layer 110 contains TEOS and was patterned with the aid of a photolithography process after it had been deposited, see for example an edge 128, which separates a region 130 which is to be protected from a region 132 which is not to be protected.

After the patterning of the protective layer 110, method steps used to fabricate a bipolar transistor are carried out in the region 132 that is not to be protected, but these steps are not explained in more detail. However, in the method steps for fabricating the bipolar transistor, it was necessary for the wafer 114 and therefore also the transistor structure 112 and the protective layer 110 to be heated to a temperature of approximately 700° C. As a result of the heating, the protective layer 110 shrank, for example by 10%. The shrinkage produced tensile forces, which are illustrated by arrows 134 and 136 in FIG. 2A. On account of the tensile forces 134 and 136, a shear force was produced in the region of the spacers 124 and 126 and, in the region of the spacer 126, led to the formation of a crack 138 that formed all the way through the protective layer 110 as far as into the spacer 126.

The position and direction of the crack 138 shown in FIG. 2A is only an example. For example, there are cracks which make contact with the spacer 126 elsewhere, which have a different positional angle with respect to the surface of the wafer 114 and which have a different crack depth than the crack 138 illustrated in FIG. 2A. The lengths of the cracks also differ. For example, there are also cracks that do not penetrate all the way through the protective layer 110.

Figure 2B:
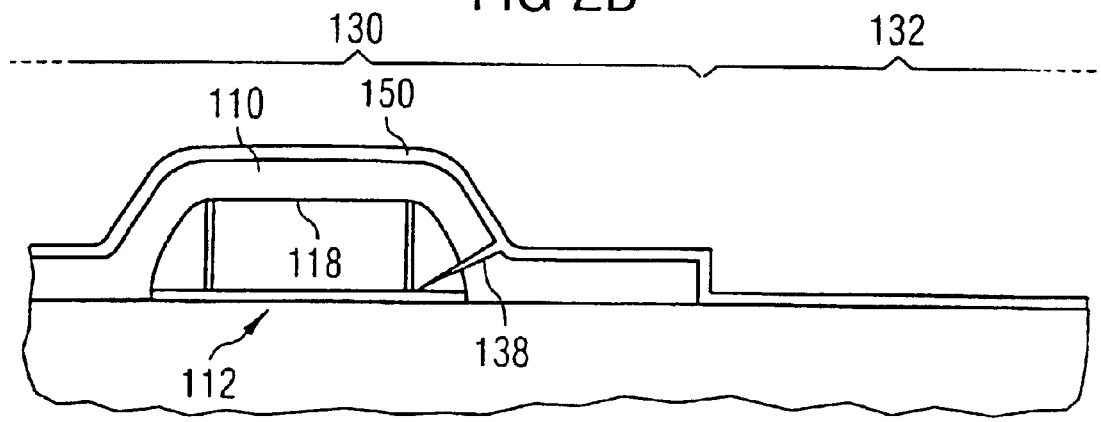

FIG. 2B shows the transistor structure 112 illustrated in FIG. 2A after a repair layer 150, which likewise is formed from TEOS, has been applied. The repair layer 150 is significantly thinner than the protective layer 110, which is, for example, 100 nm thick; by way of example, the repair layer 150 has a thickness of only 20 nm. The repair layer 150 was applied using reaction conditions that ensure a conformal deposition, so that the repair layer 150 has a uniform thickness of 20 nm both in the region 130 that is to be protected and in the region 132 that is not to be protected. In the exemplary embodiment shown in FIG. 2B, the repair layer 150 remains in place over a large area on the protective layer 110 and on the region 132.

Figure 2C:
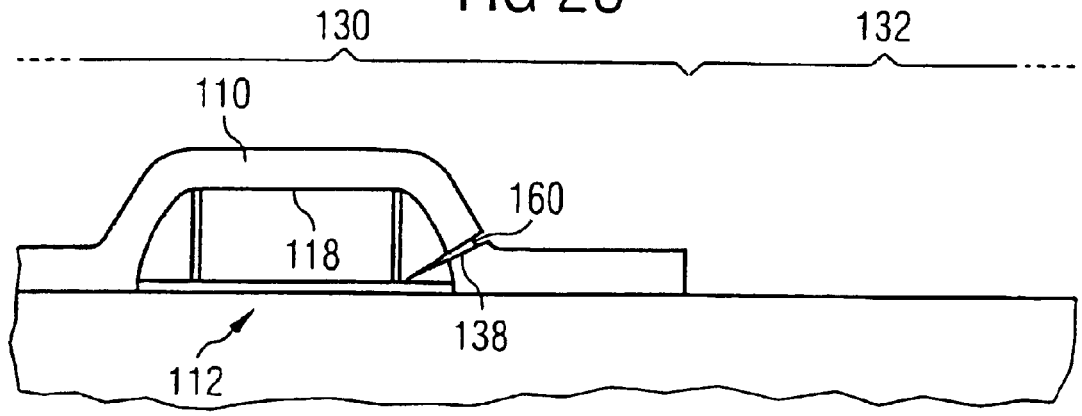

FIG. 2C shows the structure illustrated in FIG. 2B after an etching-back step in which only the repair layer 150 has been removed, but the protective layer 110 on the transistor structure 112 and on the wafer 114 is retained. There was no over-etching, i.e. the protective layer 110 retains its original thickness. Residues 160 that continue to substantially completely close up the crack 138, remain in the region of the crack 138. The region 130 that is not to be protected is uncovered again by the etching-back step.

After the repair layer 150 has been etched back, further processes, for example deposition, patterning, implantation and conditioning operations, are carried out in the region 132 that is not to be protected. During these processes, the protective layer 110 continues to protect the transistor structure 112 very effectively, since the crack 138 has been repaired, see the residues 160 in the crack 138. Moreover, the protective layer 110 only shrinks to an insignificant extent during the conditioning steps carried out after the repair, so that no further cracks are formed. Therefore, a further repair is not required and is therefore omitted.

FIG. 2D shows the structure illustrated in FIG. 2C after an isotropic etching step for removing the protective layer 110. The transistor structure 112 is uncovered again by the etching step, so that it can be processed in further process steps, for example in order to form silicide, for example titanium silicide. After the protective layer 110 has been removed, the crack 138 remains closed up by residues 160 of the repair layer 150. Accordingly, it is impossible for any impurities to penetrate into the crack 138 even during the depositing of a silicide layer 170 and to thus reach the vicinity of the extremely sensitive gate insulation layer 116.

FIG. 3 shows a transistor structure 212 that has been applied to a silicon wafer 214. The transistor structure 212 includes a gate oxide 216, a gate electrode 218, a side wall oxide 222 and a spacer 226 made from nitride. To protect the transistor structure 212, the same method steps as have been explained with reference to the first exemplary embodiment and/or with reference to the second exemplary embodiment, i.e. in particular the application of a protective layer and of a repair layer, were carried out. The protective layer and the repair layer both are formed of, for example, of silicon dioxide that is applied using a chemical vapor deposition (CVD) processes. After removal of the protective layer in a selective etching process, e.g. by hydrofluoric acid (HF), residues 260 which effectively protect the transistor structure 212 from impurities remain in a crack 238. The residues 260 is formed from TEOS.

In other exemplary embodiments, semiconductor structures that differ from the semiconductor structures illustrated in the figures, for example a p-channel MOS transistor, are protected with the aid of the protective layer.

Using the methods that have been explained results in many advantages. The original function of the protective layer as an etching stop layer can be restored by filling the cracks. The protective layer can be removed by an isotropic fixed-time etch or by an etch with end-point detection, since the repair restores the original minimum thickness of the protective layer. It is not necessary for the etching process used to remove the covering layer to have a good selectivity with respect to the structure or layer that lies below the protective layer. Provided that the layer thickness of the repair layer is at least half the crack width, cracks are completely filled. Only a repair layer, which is relatively thin compared to the protective layer, is deposited in addition to the protective layer. The protective layer only has a thickness that would be required of a protective layer in that there are no measures to prevent formation of cracks. Cracks that pass all the way into the substrate or extend into the gate oxide cannot be repaired. However, closing up these cracks prevents the damage from being increased during subsequent processes.

I claim:

1. A fabrication method, which comprises the steps of:
    providing a given semiconductor structure, the semiconductor structure being selected from the group consisting of a field-effect structure, a transistor structure, a gate insulation layer, and a spacer structure for assisting in an implantation of source regions;
    applying a protective layer to the given structure;
    carrying out at least one intermediate process and the intermediate process leading to a formation of cracks in the protective layer resulting in an impairment of a protective action of the protective layer;
    applying a repair layer to the protective layer; and
    removing the repair layer, at least one of, before an application of further layers and before carrying out subsequent process steps.

2. The method according to claim 1, which comprises forming the repair layer to have a thickness significantly less than a thickness of the protective layer.

3. The method according to claim 1, which comprises forming the repair layer from a same material as a material of the protective layer.

4. The method according to claim 1, which comprises forming the repair layer from a different material than a material of the protective layer.

5. The method according to claim 1, which comprising performing the removing step by at least one etching process selected form the group consisting of an isotropic etching process, a wet-chemical etching process, a fixed-time etching process, and an etching process in which an end point is recorded, residues of the repair layer remaining in the cracks in the protective layer.

6. The method according to claim 1, which comprises:
    producing the semiconductor structure on a substrate;
    applying the protective layer to the semiconductor structure; and
    carrying out the intermediate process to one of further fabricate the semiconductor structure and for fabricating a further semiconductor structure on the substrate.

7. The method according to claim 6, which comprises forming the further semiconductor structure as a bipolar transistor.

8. The method according to claim 1, which comprises using a conformal deposition process to apply the repair layer.

9. The method according to claim 1, which comprises:
    forming the protective layer from at least one layer selected from the group consisting of a silicon dioxide layer and a TEOS layer; and
    forming the repair layer from at least one layer selected from the group consisting of a silicon dioxide layer and a TEOS layer.

10. The method according to claim 1, which comprises forming the semiconductor structure to be protected with spacer structures for assisting in an implantation process, the spacer structures containing a material selected from the group consisting of silicon dioxide, TEOS, and nitride.

11. The method according to claim 1, which comprises carrying out the intermediate process at a temperature of approximately 700° C. to 900° C.

12. The method according to claim 1, which comprises applying the repair layer immediately before performing a subsequent etching step for removing the protective layer.

13. The method according to claim 1, wherein at least one of the subsequent process steps is a process that without an application of the repair layer, the given structure protected by the protective layer would be damaged when the process is carried out, on account of a reduced protective action of the protective layer, on account of the cracks formed, resulting in an impairment of a function of the semiconductor structure.

14. The method according to claim 1, which comprises forming the repair layer to have a thickness less than one-third of a thickness of the protective layer.

15. The method according to claim 1, which comprises forming the repair layer to have a thickness half a maximum crack width.

16. The method according to claim 1, which comprises applying the repair layer using a same process as the protective layer.

17. The method according to claim 1, which comprises applying the repair layer using a different process than a process used for applying the protective layer.

18. The method according to claim 1, which comprises removing a further layer that has been applied after a removal of the repair layer.

* * * * *